United States Patent
Ichimura et al.

(10) Patent No.: US 9,382,641 B2
(45) Date of Patent: Jul. 5, 2016

(54) EPITAXIAL SUBSTRATE FOR SEMICONDUCTOR DEVICE, SEMICONDUCTOR DEVICE, AND METHOD OF MANUFACTURING EPITAXIAL SUBSTRATE FOR SEMICONDUCTOR DEVICE

(75) Inventors: Mikiya Ichimura, Nagoya (JP); Makoto Miyoshi, Nagoya (JP); Mitsuhiro Tanaka, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 12/767,041

(22) Filed: Apr. 26, 2010

(65) Prior Publication Data

US 2010/0289029 A1 Nov. 18, 2010

(30) Foreign Application Priority Data

May 12, 2009 (JP) .................. 2009-115582

(51) Int. Cl.
*H01L 29/20* (2006.01)
*C30B 25/02* (2006.01)
*C30B 19/00* (2006.01)
(Continued)

(52) U.S. Cl.
CPC ........... *C30B 25/02* (2013.01); *C30B 19/00* (2013.01); *C30B 23/02* (2013.01); *C30B 29/403* (2013.01); *C30B 29/406* (2013.01); *H01L 21/0237* (2013.01); *H01L 21/0242* (2013.01); *H01L 21/0254* (2013.01); *H01L 21/0262* (2013.01); *H01L 21/02458* (2013.01); *H01L 29/2003* (2013.01); *H01L 29/7786* (2013.01)

(58) Field of Classification Search
CPC ............ H01L 29/66431; H01L 29/66446; H01L 29/66462
USPC .................................................. 257/190, 192
See application file for complete search history.

(56) References Cited

U.S. PATENT DOCUMENTS 6,429,467 B1    8/2002  Ando
6,787,820 B2 *  9/2004  Inoue et al. ................. 257/192
(Continued)

FOREIGN PATENT DOCUMENTS

BE  EP 1 612 866    *  7/2014  ............ H01L 29/778
EP     1 801 865 A1    6/2007
(Continued)

OTHER PUBLICATIONS

B.Z. Wang, et al., "*The Growth of High-Al-Content InAlGaN Quaternary Alloys by RF-MBE*," Journal of Physics D: Applied Physics, vol. 40, No. 3, Feb. 7, 2007, pp. 765-768.
(Continued)

*Primary Examiner* — Eugene Lee
(74) *Attorney, Agent, or Firm* — Burr & Brown, PLLC

(57) ABSTRACT

An epitaxial substrate having preferable two dimensional electron gas characteristic and contact characteristic is provided in the present invention. A channel layer is formed on a base substrate with GaN. A spacer layer is formed on the channel layer with AlN. A barrier layer is formed on the spacer layer with group III nitride having a composition of $In_xAl_yGa_zN$ (wherein x+y+z=1) and at least including In, Al, and Ga such that the composition of the barrier layer is within the range surrounded with four lines defined in accordance with the composition on a ternary phase diagram with InN, AlN, and GaN as vertexes.

16 Claims, 12 Drawing Sheets

(51) Int. Cl.
  *C30B 23/02* (2006.01)
  *C30B 29/40* (2006.01)
  *H01L 21/02* (2006.01)
  *H01L 29/778* (2006.01)

(56) References Cited

U.S. PATENT DOCUMENTS

| | | | |
|---|---|---|---|
| 7,170,111 B2* | 1/2007 | Saxler | H01L 29/2003 257/194 |
| 7,199,408 B2* | 4/2007 | Miyoshi | H01L 29/7787 257/192 |
| 7,501,670 B2* | 3/2009 | Murphy | H01L 27/0605 257/194 |
| 7,544,963 B2* | 6/2009 | Saxler | H01L 29/7783 257/194 |
| 7,547,928 B2* | 6/2009 | Germain | H01L 29/452 257/12 |
| 7,615,452 B2* | 11/2009 | Sato | H01L 29/42316 257/E21.566 |
| 7,652,311 B2* | 1/2010 | Beach | 257/194 |
| 7,705,371 B2* | 4/2010 | Nakazawa et al. | 257/192 |
| 7,728,356 B2* | 6/2010 | Suh | H01L 29/1066 257/183 |
| 8,062,931 B2* | 11/2011 | Lorenz | H01L 29/7787 257/626 |
| 8,089,097 B2* | 1/2012 | D'Evelyn | C30B 25/02 257/194 |
| 8,309,987 B2* | 11/2012 | Derluyn et al. | 257/192 |
| 8,399,911 B2* | 3/2013 | Derluyn et al. | 257/192 |
| 2002/0017696 A1* | 2/2002 | Nakayama | H01L 21/28587 257/471 |
| 2006/0006414 A1 | 1/2006 | Germain et al. | |
| 2007/0018198 A1* | 1/2007 | Brandes et al. | 257/183 |
| 2007/0278507 A1 | 12/2007 | Nakazawa et al. | |
| 2007/0295990 A1* | 12/2007 | Higashiwaki | 257/192 |
| 2008/0124851 A1* | 5/2008 | Zhang | H01L 29/7787 438/172 |
| 2008/0237606 A1* | 10/2008 | Kikkawa | H01L 29/66462 257/76 |
| 2009/0189188 A1* | 7/2009 | Matsushita | H01L 29/1029 257/192 |
| 2010/0258841 A1* | 10/2010 | Lidow | H01L 29/1066 257/192 |
| 2010/0258912 A1* | 10/2010 | Beach | H01L 21/0237 257/615 |
| 2010/0270591 A1* | 10/2010 | Ahn | H01L 29/7782 257/194 |

FOREIGN PATENT DOCUMENTS

| | | |
|---|---|---|
| JP | 2000-012834 A1 | 1/2000 |
| JP | 2000-223697 | 8/2000 |
| JP | 2003-178976 | 6/2003 |
| JP | 2003-243424 | 8/2003 |
| JP | 2004-311492 | 11/2004 |
| JP | 2004-311913 | 11/2004 |
| JP | 2005-277357 | 10/2005 |
| JP | 2006-024927 A1 | 1/2006 |
| JP | 2007-200975 | 8/2007 |
| JP | 2007-324263 A1 | 12/2007 |
| JP | 2010-40828 | 2/2010 |
| WO | 2006/022453 | 3/2006 |
| WO | WO 2008/061778 * | 5/2008 ............ H01L 21/335 |

OTHER PUBLICATIONS

S. Suihkonen, et al., "*MOVPE Growth and Characterization of InAlGaN Films and InGaN/InAlGaN MQW Structures,*" Journal of Crystal Growth, vol. 310, No. 7-9, Apr. 1, 2008, pp. 1777-1780.

Toshihide Kikkawa, "*Highly Reliable 250 W gaN High Electron Mobility Transistor Power Amplifier,*" Japanese Journal of Applied Physics, vol. 44, No. 7A, 2005, pp. 4896-4901.

Stacia Keller, et al., "*Gallium Nitride Based High Power Heterojunction Field Effect Transistors: Process Development and Present Status at UCSB,*" IEEE Transactions on Electron Devices, vol. 48, No. 3, Mar. 2001, pp. 552-559.

Makoto Miyoshi, et al., "*Characterization of Different-Al-Content AlGaN/GaN Heterostructures and High-Electron-Mobility Transistors Grown on 100-mm-Diameter Sapphire Substrates by Metalorganic Vapor Phase Epitaxy,*" Japanese Journal of Applied Physics, vol. 43, No. 12, 2004 pp. 7939-7943.

Yang Liu, et al., "*Novel Quaternary AlInGaN/GaN Heterostructure Field Effect Transistors,*" Japanese Journal of Applied Physics, vol. 45, No. 7, 2006, pp. 5278-5731.

Japanese Office Action, Japanese Application No. 2009-115582, dated Sep. 24, 2013 (4 pages).

Japanese Decision of Rejection (Application No. 2009-115582) dated Mar. 4, 2014.

* cited by examiner

F I G . 2
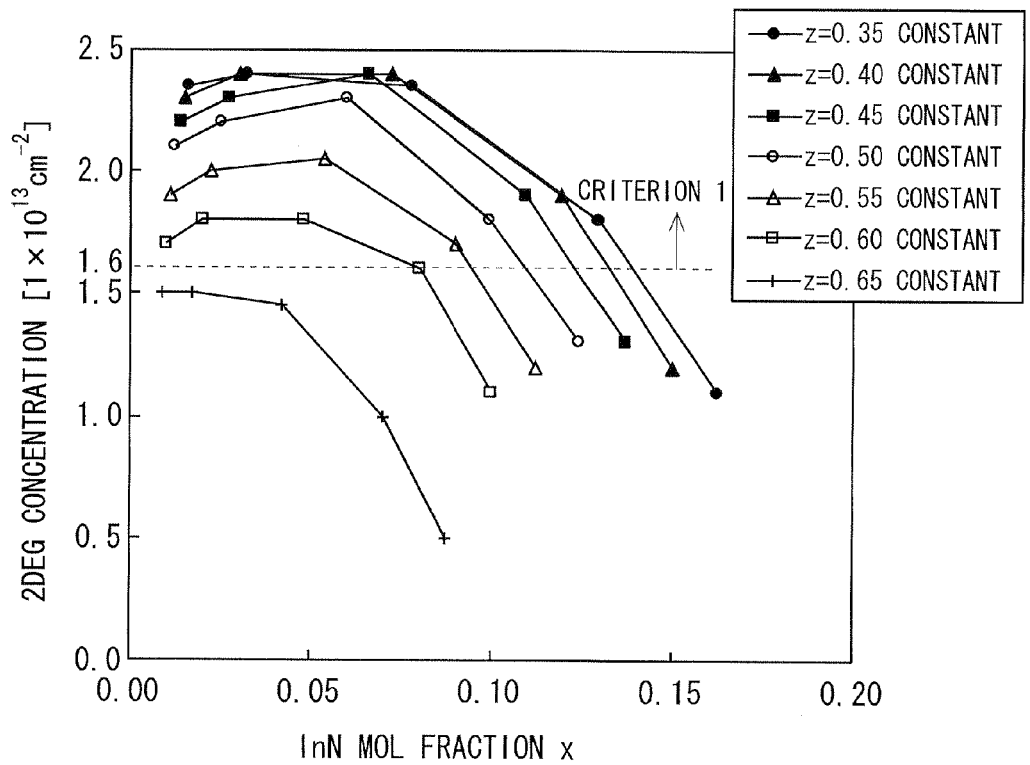

F I G . 4
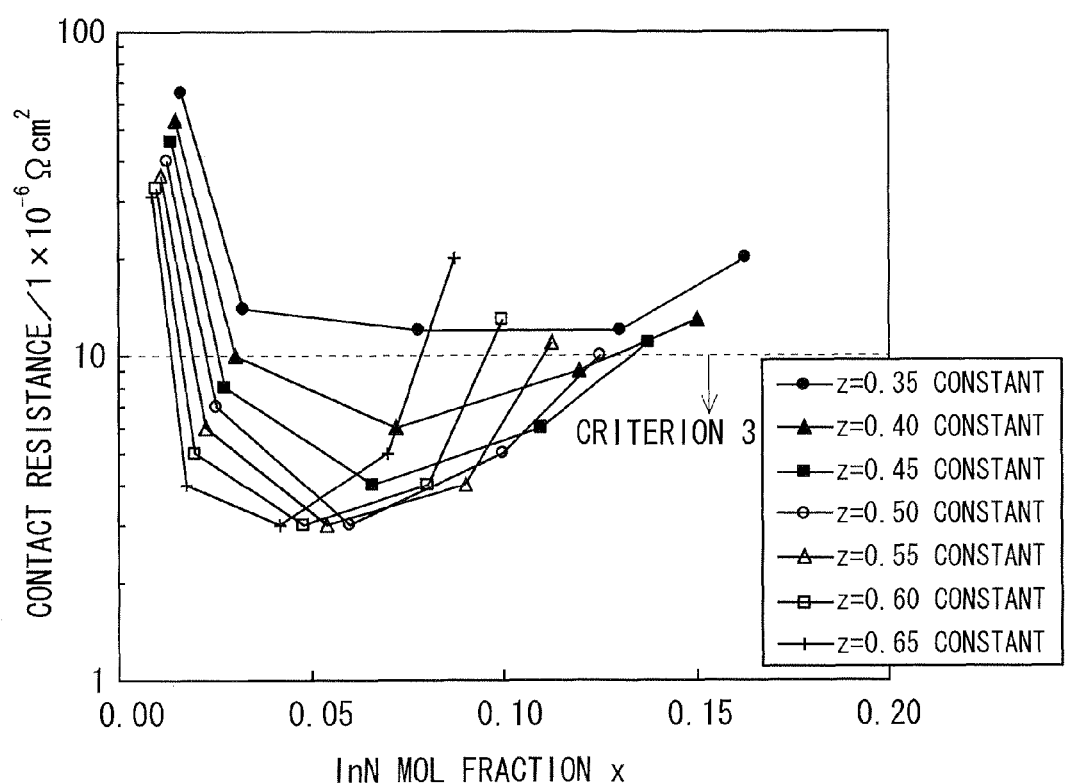

F I G . 5
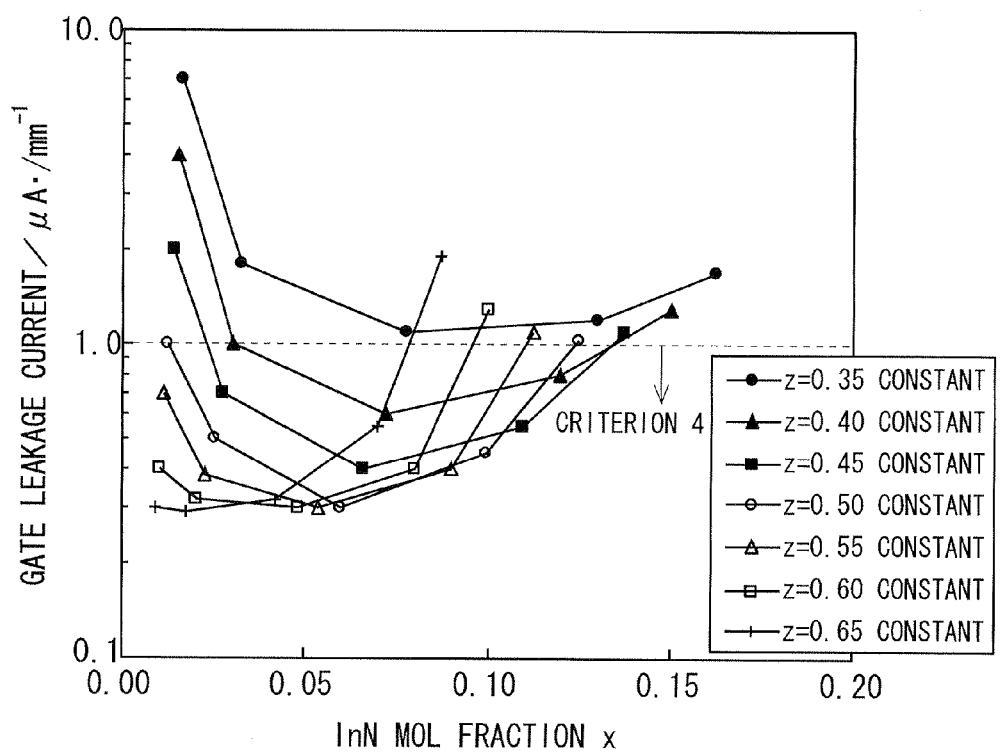

LINE (1) : 4x=y=0.8(1-z)
LINE (2) : 19x=y=0.95(1-z)
LINE (3) : z=0.6
LINE (4) : z=0.4

F I G. 7

| InAlGaN BARRIER LAYER COMPOSITION | | | 2DEG CONCENTRATION $[1 \times 10^{13} \text{cm}^{-2}]$ | 2DEG MOBILITY $[\text{cm}^2\text{V}^{-1}\text{s}^{-1}]$ | CONTACT RESISTANCE $[1 \times 10^{-6} \Omega \text{cm}^2]$ | GATE LEAKAGE CURRENT $[\mu \text{A/mm}]$ |
|---|---|---|---|---|---|---|
| InN FRACTION:x | AlN FRACTION:y | GaN FRACTION:z | | | | |
| 0.01 | 0.34 | 0.65 | 1.50 | 1480 | 31 | 0.30 |
| 0.02 | 0.33 | 0.65 | 1.50 | 1500 | 4 | 0.29 |
| 0.04 | 0.31 | 0.65 | 1.45 | 1500 | 3 | 0.32 |
| 0.07 | 0.28 | 0.65 | 1.00 | 1320 | 5 | 0.55 |
| 0.09 | 0.26 | 0.65 | 0.50 | 960 | 20 | 1.90 |
| 0.01 | 0.39 | 0.60 | 1.70 | 1400 | 33 | 0.40 |
| 0.02 | 0.38 | 0.60 | 1.70 | 1470 | 5 | 0.32 |
| 0.05 | 0.35 | 0.60 | 1.80 | 1490 | 3 | 0.30 |
| 0.08 | 0.32 | 0.60 | 1.60 | 1350 | 4 | 0.40 |
| 0.10 | 0.30 | 0.60 | 1.10 | 1150 | 13 | 1.30 |
| 0.01 | 0.44 | 0.55 | 1.90 | 1300 | 36 | 0.70 |
| 0.02 | 0.43 | 0.55 | 2.00 | 1430 | 6 | 0.38 |
| 0.05 | 0.40 | 0.55 | 2.05 | 1480 | 3 | 0.30 |
| 0.09 | 0.36 | 0.55 | 1.70 | 1370 | 4 | 0.40 |
| 0.11 | 0.34 | 0.55 | 1.20 | 1300 | 11 | 1.10 |
| 0.01 | 0.49 | 0.50 | 2.10 | 1200 | 40 | 1.00 |
| 0.03 | 0.47 | 0.50 | 2.20 | 1380 | 7 | 0.50 |
| 0.06 | 0.44 | 0.50 | 2.30 | 1460 | 3 | 0.30 |
| 0.10 | 0.40 | 0.50 | 1.80 | 1370 | 5 | 0.45 |
| 0.13 | 0.37 | 0.50 | 1.30 | 1310 | 10 | 1.03 |
| 0.01 | 0.54 | 0.45 | 2.20 | 1100 | 46 | 2.00 |
| 0.03 | 0.52 | 0.45 | 2.30 | 1350 | 8 | 0.70 |
| 0.07 | 0.48 | 0.45 | 2.40 | 1440 | 4 | 0.40 |
| 0.11 | 0.44 | 0.45 | 1.90 | 1340 | 6 | 0.55 |
| 0.14 | 0.41 | 0.45 | 1.30 | 1220 | 11 | 1.10 |
| 0.02 | 0.59 | 0.40 | 2.30 | 800 | 53 | 4.00 |
| 0.03 | 0.57 | 0.40 | 2.40 | 1300 | 10 | 1.00 |
| 0.07 | 0.53 | 0.40 | 2.40 | 1410 | 6 | 0.60 |
| 0.12 | 0.48 | 0.40 | 1.90 | 1310 | 9 | 0.80 |
| 0.15 | 0.45 | 0.40 | 1.20 | 1100 | 13 | 1.30 |
| 0.02 | 0.63 | 0.35 | 2.35 | 300 | 65 | 7.00 |
| 0.03 | 0.62 | 0.35 | 2.40 | 1220 | 14 | 1.80 |
| 0.04 | 0.57 | 0.35 | 2.35 | 1350 | 12 | 1.10 |
| 0.13 | 0.52 | 0.35 | 1.80 | 1050 | 12 | 1.20 |
| 0.16 | 0.49 | 0.35 | 1.10 | 800 | 20 | 1.70 |

F I G. 8

| HYDROGEN MIXING METHOD DURING GROWTH OF InAlGaN BARRIER LAYER | InAlGaN BARRIER LAYER COMPOSITION | | | 2DEG CONCENTRATION $[1 \times 10^{13} \text{cm}^{-2}]$ |
|---|---|---|---|---|
| | InN FRACTION: x | AlN FRACTION: y | GaN FRACTION: z | |
| (NO HYDROGEN MIXING) | 0.06 | 0.44 | 0.50 | 2.3 |
| TMI BUBBLING GAS IS HYDROGEN | 0.06 | 0.44 | 0.50 | 0.1 OR LESS |
| TMA BUBBLING GAS IS HYDROGEN | 0.06 | 0.44 | 0.50 | 0.1 OR LESS |
| TMG BUBBLING GAS IS HYDROGEN | 0.06 | 0.44 | 0.50 | 0.1 OR LESS |
| REPLACING 10% OF FLOW RATE OF NH3 CARRIER GAS INTO HYDROGEN | 0.06 | 0.44 | 0.50 | 0.1 OR LESS |

FIG. 9

| FORMATION TEMPERATURE [°C] | | | InAlGaN BARRIER LAYER COMPOSITION | | | 2DEG CONCENTRATION [$1 \times 10^{13}$ cm$^{-2}$] | 2DEG MOBILITY [cm$^2$V$^{-1}$s$^{-1}$] | CONTACT RESISTANCE [$1 \times 10^{-6}$ Ωcm$^2$] | GATE LEAKAGE CURRENT [μA/mm] |
|---|---|---|---|---|---|---|---|---|---|
| GaN | AlN | InAlGaN | InN FRACTION: x | AlN FRACTION: y | GaN FRACTION: z | | | | |
| 950 | 950 | 800 | 0.06 | 0.44 | 0.50 | 2.1 | × 700 | × 50 | × 6.0 |
| 1000 | 1000 | | 0.06 | 0.44 | 0.50 | 2.2 | 1310 | 7 | 0.6 |
| 1100 | 1100 | | 0.06 | 0.44 | 0.50 | 2.3 | 1460 | 3 | 0.3 |
| 1200 | 1200 | | 0.06 | 0.44 | 0.50 | 2.2 | 1320 | 6 | 0.5 |
| 1250 | 1250 | | 0.06 | 0.44 | 0.50 | 2.1 | × 600 | × 40 | × 4.0 |
| 1100 | 800 | | 0.06 | 0.44 | 0.50 | 2.0 | × 1210 | × 20 | × 1.3 |
| 1100 | 1100 | 600 | 0.06 | 0.44 | 0.50 | × 1.1 | 1440 | 9 | × 1.3 |
| 1100 | 1100 | 650 | 0.06 | 0.44 | 0.50 | 1.7 | 1460 | 4 | 0.5 |
| 1100 | 1100 | 900 | 0.06 | 0.44 | 0.50 | 2.2 | 1400 | 5 | 0.4 |
| 1100 | 1100 | 950 | 0.06 | 0.44 | 0.50 | 2.1 | × 1100 | × 13 | 0.9 |

FIG. 10

| AlInGaN BARRIER LAYER GROWTH PRESSURE/kPa | InAlGaN BARRIER LAYER COMPOSITION | | | 2DEG CONCENTRATION [$1 \times 10^{13}$ cm$^{-2}$] | 2DEG MOBILITY [cm$^2$V$^{-1}$s$^{-1}$] | CONTACT RESISTANCE [$1 \times 10^{-6}$ Ωcm$^2$] | GATE LEAKAGE CURRENT [μA/mm] |
|---|---|---|---|---|---|---|---|
| | InN FRACTION : x | AlN FRACTION : y | GaN FRACTION : z | | | | |
| 1 | 0.06 | 0.44 | 0.50 | 2.3 | 1460 | 3 | 0.3 |
| 10 | 0.06 | 0.44 | 0.50 | 2.3 | 1460 | 3 | 0.3 |
| 20 | 0.06 | 0.44 | 0.50 | 2.3 | 1420 | 4 | 0.4 |
| 30 | 0.06 | 0.44 | 0.50 | 2.2 | 1310 | 9 | 0.9 |
| 50 | 0.06 | 0.44 | 0.50 | 1.7 | 870 | 43 | 4.0 |

F I G . 1 1

| V/III RATIO DURING GROWTH OF InAlGaN BARRIER LAYER | InAlGaN BARRIER LAYER COMPOSITION ||| 2DEG CONCENTRATION [1×10$^{13}$ cm$^{-2}$] | 2DEG MOBILITY [cm$^2$V$^{-1}$s$^{-1}$] | CONTACT RESISTANCE [1×10$^{-6}$ Ω cm$^2$] | GATE LEAKAGE CURRENT [μA/mm] | SURFACE ROOT MEAN SQUARE ROUGHNESS Rms [nm] |
|---|---|---|---|---|---|---|---|---|
| | InN FRACTION : x | AlN FRACTION : y | GaN FRACTION : z | | | | | |
| 2500 | 0.06 | 0.44 | 0.50 | 1.9 | 1180 | 9 | 0.5 | 1.1 |
| 5000 | 0.06 | 0.44 | 0.50 | 2.2 | 1400 | 5 | 0.4 | 0.7 |
| 10000 | 0.06 | 0.44 | 0.50 | 2.3 | 1460 | 3 | 0.3 | 0.5 |
| 20000 | 0.06 | 0.44 | 0.50 | 2.3 | 1410 | 4 | 0.9 | 0.7 |
| 40000 | 0.06 | 0.44 | 0.50 | 2.0 | 1200 | 8 | 4.0 | 1.5 |

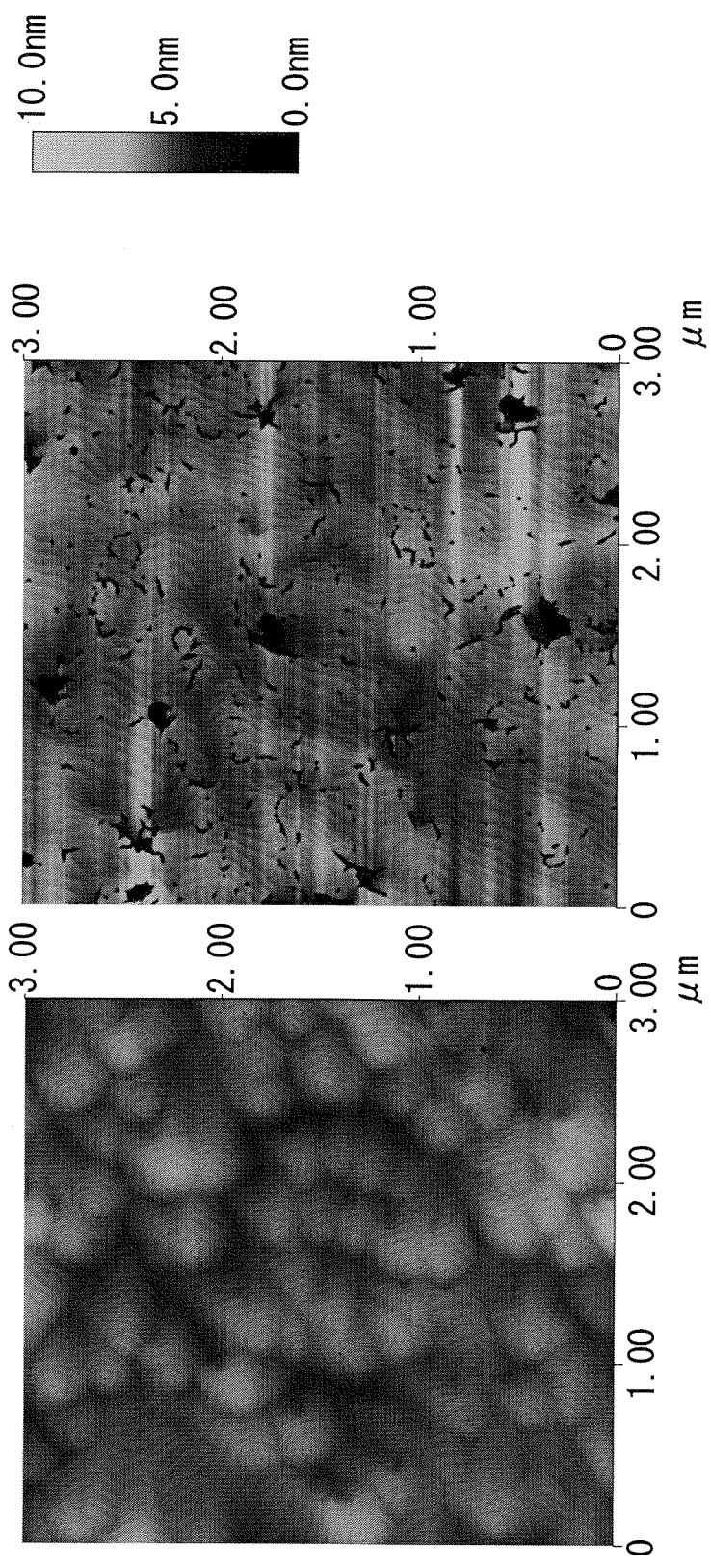

EPITAXIAL SUBSTRATE FOR SEMICONDUCTOR DEVICE, SEMICONDUCTOR DEVICE, AND METHOD OF MANUFACTURING EPITAXIAL SUBSTRATE FOR SEMICONDUCTOR DEVICE

FIELD OF THE INVENTION

The present invention relates to an epitaxial substrate having a multi-layered structure and composed of a group III nitride semiconductor device, and particularly relates to an epitaxial substrate having a multi-layered structure for electronic devices and a method of manufacturing the same.

BACKGROUND OF THE INVENTION

Nitride semiconductors having higher breakdown electric field and higher electron saturation velocities have been drawing attention as the next generation semiconductor materials for high-frequency and high-power devices. Particularly, because a multi-layered structure formed by laminating layers composed of AlGaN and GaN is characterized in generating a two dimensional electron gas (2DEG) having high concentration in a lamination interface (heterointerface) by large polarization effect (spontaneous polarization effect and piezo polarization effect) specific to nitride material, the development of a high electron mobility transistor (HEMT) using this multi-layered structure for a substrate has been actively made (for example, see "Highly Reliable 250 W High Electron Mobility Transistor Power Amplifier", TOSHIHIDE KIKKAWA, Jpn. J. Appl. Phys. Vol. 44, No. 7A, (2005), pp. 4896-4901).

In order to commercialize such an HEMT device and a substrate for an HEMT device having a multi-layered structure used for manufacturing the HEMT device, various problems should be solved: problems relating to the improvement of performance such as power density increase and high efficiency, ones relating to the improvement of function such as a normally-off operation, fundamental ones such as high reliability and price cuts and the like. For each problem, active efforts have been made.

For instance, if the concentration of two dimensional electron gas inherent to the substrate for an HEMT device is greatly increased, controllable current density of the HEMT device, i.e. usable power density is increasingly improved. In the case of a nitride HEMT device having the most usual composition of forming a channel layer with GaN and forming a barrier layer with AlGaN, the two dimensional electron gas concentration has been known to increase in accordance with the increase of AlN mol fraction in AlGaN forming the barrier layer (for example, see "Gallium Nitride Based High Power Heterojunction Field Effect Transistors: process Development and Present Status at UCSB", Stacia Keller, Yi-Feng Wu, Giacinta Parish, Naigian Ziang, Jane J. Xu, Bernd P. Keller, Steven P. DenBaars, and Umesh K, Mishra, IEEE Trans. Electron Devices 48, (2001), 552, and "Characterization of Different-Al-Content AlGaN/GaN Heterostructures and High-Electron-Mobility Transistors Grown on 100-mm-Diameter Sapphire Substrates by Metalorganic Vapor Phase Epitaxy", Makoto Miyoshi et al., Jpn. J. Appl. Phys. Vol. 43, No. 12, (2004), pp. 7939-7943).

It has been attempted to individually control distortion stress and a energy band structure by forming the channel layer with GaN and forming the barrier layer with InAlGaN, thereby to improve electrical characteristics of the HEMT device (for example, see "Novel Quaternary AlInGaN/GaN Heterostructure Field Effect Transistors on Sapphire Substrate", Yang Liu et al., Jpn. J. Appl. Phys. Vol. 45, No. 7, (2005), pp. 5728-5731).

It has been also attempted to form the channel layer with GaN, form the barrier layer with AlGaN, and form a capping layer with InAlGaN thereon, thereby to improve contact resistance characteristic of the HEMT device (for example, see Japanese Patent Application Laid-Open No. 2007-324263).

In the case of the HEMT device having a heterostructure of AlGaN/GaN disclosed in KIKKAWA, Keller et al., and Miyoshi et al., if a barrier layer is formed of AlGaN having a large AlN mol fraction in order to increase the two dimensional electron gas concentration, tensile stress generated inside the barrier layer is made larger. This deteriorates the quality of film and aggravates the surface morphology (e.g. increase of distortion, generation of cracks, and the like). As a result, various problems have been caused, such that high concentration of two dimensional electron gas is not obtained as expected, various contact characteristics such as ohmic characteristic, Schottky characteristic and the like is deteriorated and unnecessary surface level arises and causes deterioration of device dynamic characteristics.

It has been pursued to employ InAlGaN quaternary mixed crystal for the barrier layer as the HEMT device having the heterostructure of InAlGaN/GaN disclosed in Liu et al, thereby to improve the electric characteristics while individually controlling the tensile stress and the band structure produced inside the barrier layer. However, it is insufficient to be provided as a practical device because the mobility of the two dimensional electron gas is as low as 700 $cm^2/Vs$ due to the combined factor such that composition ratio of InAlGaN quaternary mixed crystal is inappropriate, and moreover, growth condition of InAlGaN quaternary mixed crystal is inappropriate, and so on.

The device disclosed in Japanese Patent Application Laid-Open No. 2007-324263 has the advantage of reducing the contact resistance and thus improving the device characteristics by forming the capping layer with InAlGaN, but the barrier layer is formed of AlGaN so that it has the same problem as KIKKAWA, Kellar et al. and Miyoshi et al. with respect to the two dimensional electron gas concentration.

SUMMARY OF THE INVENTION

The present invention is directed to an epitaxial substrate for a semiconductor device having a multi-layered structure composed of a group III nitride semiconductor.

An epitaxial substrate according to the present invention includes: a base substrate; a channel layer made of GaN, formed on the base substrate; a spacer layer made of a group III nitride having a composition of $Al_p Ga_{1-p} N$ (wherein $0.8 \leq p < 1$), formed on the channel layer; and a barrier layer made of group III nitride having a composition of $In_x Al_y Ga_z N$ (wherein $x+y+z=1$), formed on the spacer layer, the group III nitride of the barrier layer including at least In, Al, and Ga, wherein the composition of the group III nitride of the barrier layer is within the range surrounded with the lines represented by the following formulas on a ternary phase diagram with InN, MN, and GaN as vertexes $4x=y=0.8(1-z)$ $19x=y=0.95(1-z)$ $z=0.6$, and $z=0.4$.

A method of manufacturing an epitaxial substrate according to the present invention includes the steps of: a) epitaxially forming a channel layer made of GaN on a base substrate; b) epitaxially forming a spacer layer made of group III nitride having a composition of $Al_pGa_{1-p}N$ (wherein $0.8 \leq p < 1$) on the channel layer, and c) epitaxially forming a barrier layer made of a group III nitride having a composition of $In_xAl_yGa_zN$ (wherein $x+y+z=1$) on the spacer layer, the group III nitride of the barrier layer including at least In, Al, and Ga, wherein in the step c), the composition of the group III nitride of the barrier layer is selected within the range surrounded with the lines represented by the above formulas defined in accordance with the composition of the group III nitride of the barrier layer on a ternary phase diagram with InN, AlN, and GaN as vertexes.

According to the present invention, the two dimensional electron gas having higher concentration and mobility than ever before is generated to provide the epitaxial substrate having preferable various contact characteristics such as ohmic characteristic and Schottky characteristic, and the semiconductor device using such an epitaxial substrate.

Preferably, in the method of manufacturing an epitaxial substrate, the formation temperature of the spacer layer in the step b) is substantially same as that of the channel layer in the step a), and the formation temperature of the barrier layer in the step c) is lower than that of the channel layer.

Thereby, the temperature is lowered to the formation temperature of the barrier layer after forming the spacer layer, preventing deterioration of a surface of the channel layer caused by lowering the temperature with the channel layer being exposed when the spacer layer is not provided.

It is therefore an object of the present invention to provide an epitaxial substrate having preferable two dimensional electron gas characteristics and preferable various contact characteristics.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a view plotting measurement results of two dimensional electron gas concentrations of a plurality of HEMT devices 10 manufactured by differentiating a composition of each barrier layer 5;

FIG. 4 is a view plotting measurement results of contact resistances of the plurality of HEMT devices 10 manufactured by differentiating the composition of each barrier layer 5;

FIG. 5 is a view plotting measurement results of gate leakage currents of the plurality of HEMT devices 10 manufactured by differentiating the composition of each barrier layer 5;

FIG. 7 is a view showing a list of manufacturing conditions and measurement results of an HEMT device 10 according to an inventive example 1;

FIG. 8 is a view showing a list of forming conditions of a barrier layer and measurement results of the two dimensional electron gas concentration of an HEMT device 10 according to an inventive example 2;

FIG. 9 is a view showing a list of manufacturing conditions and measurement results of an HEMT device 10 according to an inventive example 3;

FIG. 10 is a view showing a list of manufacturing conditions and measurement results of an HEMT device 10 according to an inventive example 4;

FIG. 11 is a view showing a list of manufacturing conditions and measurement results of an HEMT device 10 according to an inventive example 5; and FIG. 12 is a view showing AFM images of an epitaxial substrate.

DETAILED DESCRIPTION OF THE INVENTION

<Configuration of HEMT Device>

Figure 1:
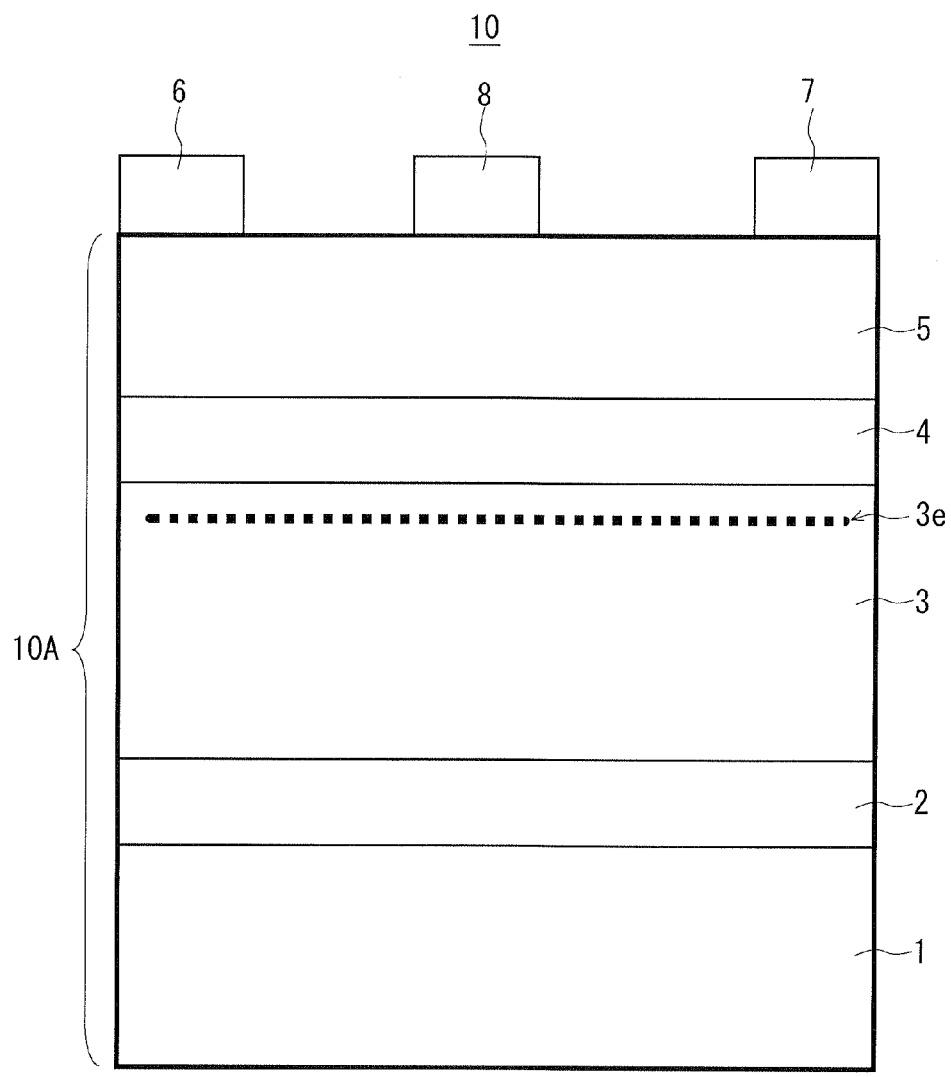
FIG. 1 is a sectional diagram schematically showing a configuration of an HEMT device 10 according to a preferred embodiment of the present invention.
Figure 3:
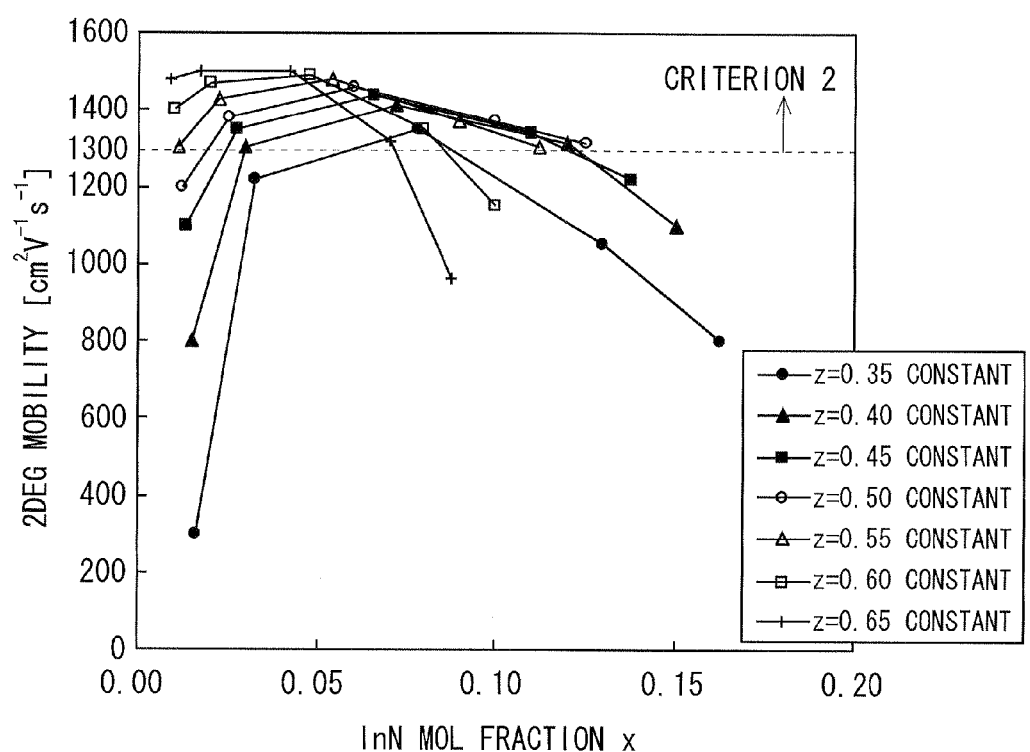
FIG. 3 is a view plotting measurement results of two dimensional electron gas mobilities of the plurality of HEMT devices 10 manufactured by differentiating the composition of each barrier layer 5.

FIG. 1 is a sectional diagram schematically showing a configuration of an HEMT device 10 according to a preferred embodiment of the present invention. The HEMT device 10 has a configuration in which a substrate 1, a buffer layer 2, a channel layer 3, a spacer layer 4, and a barrier layer 5 are laminated. A preferable example is to epitaxially form each of the buffer layer 2, the channel layer 3, the spacer layer 4, and the barrier layer 5 by a metal organic chemical vapor deposition method (MOCVD method) (described in details later). Hereinafter, a laminated structure obtained by laminating the substrate 1, the buffer layer 2, the channel layer 3, the spacer layer 4, and the barrier layer 5 is referred to as an epitaxial substrate 10A. A ratio of a thickness of each layer in FIG. 1 does not reflect the actual ratio.

The description will be made below for the case of using the MOCVD method for forming each layer. However, other epitaxial growth methods, e.g., MBE, HYPE, LPE and the like appropriately selected from various vapor-phase growth method and liquid-phase growth method may be employed, or different growth methods may be combined, as long as it is capable of forming each layer so as to have preferable crystalline quality.

The substrate 1 is used without specific limitations as long as a nitride semiconductor layer having preferable crystalline quality is formed thereon. While a sapphire substrate is preferably used, a substrate made of monocrystalline 6H—SiC, 4H—SiC, Si, GaAs, spinel, MgO, ZnO, ferrite, and the like may be used.

The buffer layer 2 is formed of GaN, having a thickness of approximately several tens of nm so as to form the channel layer 3, the spacer layer 4, and the barrier layer 5 having preferable crystalline quality thereon. For example, a preferable thickness is 25 nm.

The channel layer 3 is formed of GaN, having a thickness of approximately several μm. For example, a preferable thickness is 3 μm.

The spacer layer 4 is formed in order to enhance the confinement effect of the two dimensional electron gas. The spacer layer 4 is formed of AlN, having a thickness in the range of between 0.5 nm and 1.5 nm. For example, a preferable thickness is 1 nm. When the spacer layer 4 is formed to have the thickness of less than 0.5 nm, the formation of the layer is incomplete so that the confinement effect of the two dimensional electron gas is not sufficiently produced. In contrast, when the spacer layer 4 is formed to have the thickness of more than 1.5 nm, the film quality of the spacer layer 4 itself deteriorates in accordance with inner stress.

Meanwhile, the barrier layer 5 is formed of group III nitride having a composition of $In_xAl_yGa_zN$ (wherein, x+y+z=1) and including at least In, Al, and Ga so as to have a thickness of between approximately several nm and several tens of nm. A preferable thickness is 20 nm. In the present preferred embodiment, the relation that a bandgap of AlN forming the spacer layer 4 is larger than that of group III nitride forming the barrier layer 5 is established regardless of the composition of the barrier layer 5. The barrier layer 5 will be described in details later.

In the HEMT device 10 having the above layer configuration (in the epitaxial substrate 10A), the interface between the channel layer 3 and the barrier layer 5 (more in detail, an interface region including the spacer layer 4) is to be a heterojunction interface so that a two dimensional electron gas region 3e having two dimensional electron gas with high concentration is formed in this interface (more in detail, near the interface of the channel layer 3) by spontaneous polarization effect and piezo polarization effect. This interface is formed to have an average roughness within the range of between 0.1 nm and 3 nm and a root mean square roughness within the range of between 0.1 nm and 3 nm in order to generate the above two dimensional electron gas. A flat interface exceeding the above range may be formed, however, this is not realistic in consideration of cost and manufacturing yield. Preferably, this interface is formed to have the average roughness within the range of between 0.1 nm and 1 nm and the root mean square roughness within the range of between 0.1 nm and 1 nm. In this case, it is more preferable that an ohmic characteristic is obtained between each of a source electrode 6 and a drain electrode 7 and the barrier layer 5. At the same time, it is more preferable that an Schottky characteristic is obtained between a gate electrode 8 and the barrier layer 5. In addition, the confinement effect of the two dimensional electron gas is more enhanced to generate the two dimensional electron gas with higher concentration.

In the HEMT device 10, the source electrode 6, the drain electrode 7, and the gate electrode 8 are provided on the barrier layer 5. The source electrode 6 and the drain electrode 7 are multi-layered metal electrodes made of Ti/Al/Ni/Au, each layer having a thickness of approximately between a dozen nm and a hundred and several tens of nm. Each of the source electrode 6 and the drain electrode 7 is formed to have an ohmic contact with the barrier layer 5. On the other hand, the gate electrode 8 is a multi-layered metal electrode made of Pd/Au, each layer having a thickness of approximately between a dozen nm and a hundred and several tens of nm. The gate electrode 8 is formed to have a Schottky contact with the barrier layer 5.

<Relation Between Composition of Barrier Layer and Characteristics>

In the present preferred embodiment, by providing a composition of the group III nitride composing the barrier layer 5 to satisfy predetermined conditions, the epitaxial substrate 10A, and further, the HEMT device 10 are achieved such that a contact resistance between the barrier layer 5 and the source electrode 6 or the drain electrode 7 (simply referred to as a contact resistance) is reduced and a leakage current density from the gate electrode 8 to the barrier layer 5 at the time of applying inverse voltage (simply referred to as a gate leakage current) is reduced, while the two dimensional electron gas region 3e having two dimensional electron gas with higher concentration and higher mobility than ever before is provided.

Each of FIGS. 2, 3, 4, and 5 is a view plotting an example of the results of measuring the two dimensional electron gas concentration (2DEG concentration), the two dimensional electron gas mobility (2DEG mobility), the contact resistance, and the gate leakage current with respect to a plurality of HEMT devices 10 manufactured by variously differentiating the composition of each barrier layer 5. In the present specification, the two dimensional electron gas concentration and the two dimensional electron gas mobility are measured by the Hall effect method. The contact resistance is measured by a transmission line model method (TLM method). The gate leakage current is measured by a 2-terminal gate-drain I-V measurement method.

Each of FIGS. 2 through 5 also shows a criterion with respect to each characteristic value considered to be necessary for putting the HEMT device 10 into practical use (hereinafter, referred to as a "device characteristic criterion"). Specifically, this device characteristic criterion is set to be no less than $1.6 \times 10^{13}$ cm$^{-2}$ for the two dimensional electron gas concentration (criterion 1), no less than 1300 cm$^2$V$^{-1}$s$^{-1}$ for the two dimensional electron gas mobility (criterion 2), no more than $10 \times 10^{-6}$ Ωcm$^2$ for the contact resistance (criterion 3), and no more than 1.0 μAmm$^{-1}$ for the gate leakage current (criterion 4). The HEMT device 10 will have excellent device characteristics more than ever before by satisfying all these device characteristic criteria. It has been extremely difficult for the conventional AlGaN/GaN heterostructure to accomplish the epitaxial substrate and the HEMT device satisfying these four device characteristic criteria at the same time.

Figure 6:
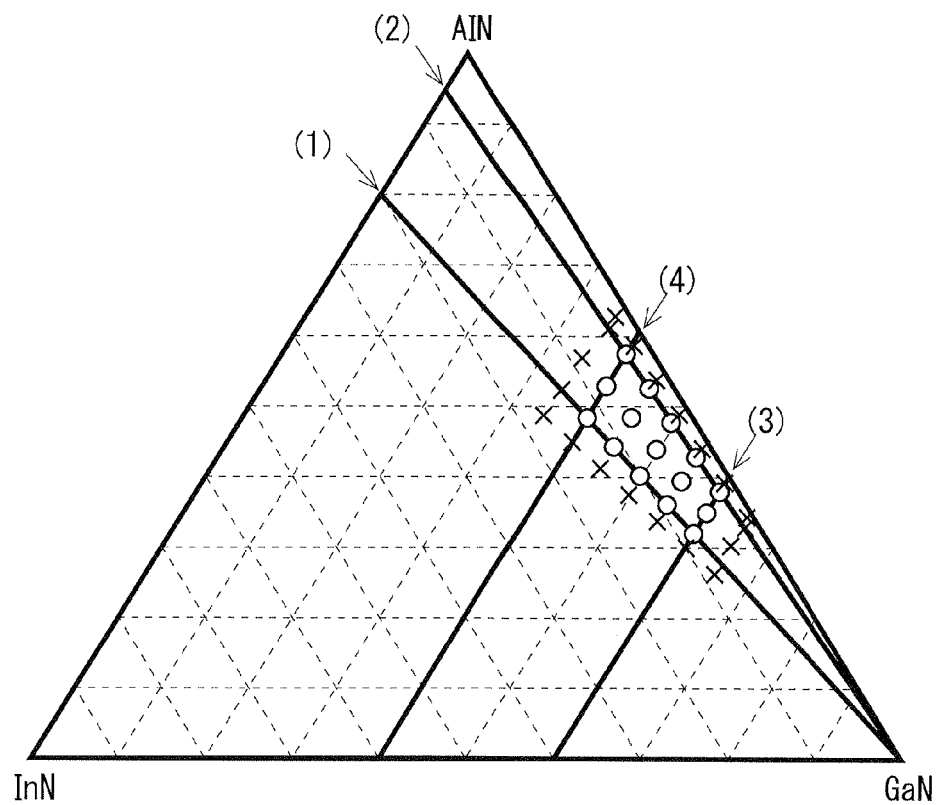
FIG. 6 is a view of a ternary phase diagram with three components of InN, AlN, and GaN as vertexes where the relation of the two dimensional electron gas concentration, the two dimensional electron gas mobility, the contact resistance, and the gate leakage current with the composition of the barrier layer 5 has been mapped.

FIG. 6 is a view of the ternary phase diagram with three components of InN, MN, and GaN as the vertexes where the relation of the two dimensional electron gas concentration, the two dimensional electron gas mobility, the contact resistance, and the gate leakage current with the composition of the barrier layer 5 has been mapped in accordance with whether or not satisfying the above four device characteristic criteria on the basis of the results shown in FIGS. 2 and 5. In FIG. 6, the HEMT devices 10 satisfying all the four device characteristic criteria are mapped with circles and the HEMT devices 10 not satisfying at least either one of the four device characteristic criteria are mapped with crosses. FIG. 6 indicates that the HEMT devices 10 satisfying all the four device characteristic criteria are obtained. As a result, FIG. 6 conducts that the HEMT device 10 satisfying all the device characteristic criteria is accomplished when the composition of the barrier layer 5 is selected from the range surrounded with four lines (1) to (4) represented by each formula shown below in the ternary phase diagram of FIG. 6.

$$4x = y = 0.8(1-z) \quad (1)$$

$$19x = y = 0.95(1-z) \quad (2)$$

$$z = 0.6 \quad (3)$$

$$z = 0.4 \quad (4)$$

That is, the result shown in FIG. 6 indicates that the HEMT device 10 is obtained such that the two dimensional electron gas region 3e is formed with higher concentration and mobility than ever before on the heterojunction interface and the contact resistance and the gate leakage current are preferably reduced, by manufacturing the HEMT device 10 using the epitaxial substrate 10A in which the channel layer 3 is formed of GaN, the spacer layer 4 is formed of AlN, and the barrier layer 5 is formed of the composition satisfying the above range.

When the composition ratio of In in the barrier layer 5 is larger than the composition represented by the line (1) in FIG. 6 and the composition ratio of Ga in the barrier layer 5 is larger than the composition represented by the line (3) in FIG. 6, the two dimensional electron gas concentration does not satisfy the above criteria. When the composition ratio of In in the barrier layer 5 is smaller than the composition represented by the line (2) in FIG. 6, the contact resistance does not satisfy the above criteria. Further, when the composition ratio of Ga in the barrier layer 5 is smaller than the composition represented by the line (4) in FIG. 6, the gate leakage current increases.

The argument on the composition range described above does not exclude the case where the channel layer 3, the spacer layer 4, and the barrier layer 5 include impurities. For instance, the channel layer 3, the spacer layer 4, and the barrier layer 5 may include oxygen atom with a concentration in the range of no less than 0.0005 at % ($1\times10^{17}/cm^3$) and no more than 0.05 at % ($1\times10^{19}/cm^3$) and carbon atom with a concentration in the range of no less than 0.0010 at % ($2\times10^{17}/cm^3$) and no more than 0.05 at % ($1\times10^{19}/c$. While the concentration of each of the oxygen atom and the carbon atom may be smaller than each lower limit in the above range, it is not realistic in consideration of costs and manufacturing yield. Meanwhile, it is not preferable that the concentration of each of the oxygen atom and the carbon atom is larger than each upper limit in the above range because the crystalline quality of each layer deteriorates to the extent of causing the deterioration of the device characteristics.

<Method of Manufacturing Epitaxial Substrate and HEMT Device>

Next, the method of manufacturing the HEMT device 10 using the epitaxial substrate 10A with the barrier layer 5 having the above composition range will be described.

Hereinbelow, the case where a plurality of HEMT devices 10 are simultaneously manufactured from one substrate 1 (the case of multiple pieces manufacturing) will be described.

The epitaxial substrate 10A may be manufactured using a publicly known MOCVD furnace. Specifically, the MOCVD furnace for use is constructed to be capable of supplying organic metal (MO) material gas for In, Al, and Ga (TMI, TMA, TMG), ammonia gas, hydrogen gas, and nitrogen gas into a reactor.

For instance, a (0001) plane sapphire substrate with 2 inch diameter is prepared as a substrate 1, and the substrate 1 is placed on a susceptor provided in the reactor of the MOCVD furnace. After the atmosphere in the reactor is vacuumed, the atmosphere is regulated in a state of hydrogen/nitrogen mixed flow while the pressure in the reactor is maintained at a predetermined value of between 5 kPa and 50 kPa (e.g., 30 kPa), and then the temperature of the substrate is raised by susceptor heating.

When a susceptor temperature reaches a predetermined temperature between 400° C. and 600° C. (e.g., 500° C.) that is a formation temperature of the buffer layer, Ga material gas and ammonia gas are introduced into the reactor to form a GaN layer as the buffer layer 2. Alternatively, prior to this, thermal cleaning by maintaining high temperature may be performed.

When the GaN layer as the buffer layer 2 is formed, the susceptor temperature is maintained at a predetermined formation temperature T1 (° C.) of the channel layer, and Ga material gas and ammonia gas are introduced into the reactor to form a GaN layer as the channel layer 3. Here, the formation temperature T1 of the channel layer is a value determined within the range of 1000° C.≤T1≤1200° C. (e.g., 1100° C.).

Subsequently after the GaN layer as the channel layer 3 is formed, an AlN layer as the spacer layer 4 is formed. The AlN layer is formed by maintaining the susceptor temperature at the formation temperature T1 (° C.) of the channel layer, keeping the atmosphere of nitrogen gas in the reactor and setting the pressure in the reactor to be 10 kPa, and thereafter introducing Al material gas and ammonia gas into the reactor.

Subsequently after the AlN layer as the spacer layer 4 is formed, the susceptor temperature is maintained at the predetermined formation temperature T2 (° C.) of the barrier layer to form the atmosphere of nitrogen gas in the reactor. The formation temperature T2 of the barrier layer is a value determined within the range of 650° C.≤T2≤900° C. (e.g., 800° C.). At this time, the pressure in the reactor is maintained to be a predetermined value between 1 kPa and 30 kPa (e.g., 10 kPa). When the pressure in the reactor is the predetermined value between 1 kPa and 20 kPa, the HEMT device 10 having low ohmic contact resistance and less gate leakage current (preferable Schottky contact characteristic) is obtained. This is the effect derived from the tendency that surface flatness of the barrier layer 5 is enhanced by lowering the pressure in the reactor.

Next, ammonia gas and organic metal material gas having a flow ratio in accordance with the composition of the barrier layer 5 are introduced into the reactor such that a so-called V/III ratio is to be a predetermined value of no less than 5000 and no more than 20000, to form an $In_xAl_yGa_zN$ layer having a predetermined thickness as the barrier layer 5. The $In_xAl_yGa_zN$ layer is formed so as to have the composition satisfying the formulas (1) to (4). The preferable growth rate of the barrier layer 5 is within the range of between 0.05 and 0.5 μm/h.

When the V/III ratio is a predetermined value in the range of no less than 7000 and no more than 18000, the interface between the channel layer 3 and the barrier layer 5 is formed such that the average roughness is within the range of between 0.1 nm and 1 nm, and the root mean square roughness is within the range of between 0.1 nm and 1 nm.

In the present preferred embodiment, in manufacturing the barrier layer 5, nitrogen gas is used for all the bubbling gas and carrier gas for organic metal material. Thus, the atmosphere gas other than material gas is made of only nitrogen gas. Thereby, hydrogen termination dangling bonds are to be nitrogen termination, and then the electron structure of the barrier layer 5 is maintained in an ideal state. As a result, the two dimensional electron gas with high concentration is generated in the two dimensional electron gas region 3e. In manufacturing the barrier layer 5, it is not preferable to intentionally mix hydrogen gas in the atmosphere because the two dimensional electron gas concentration is lowered.

As described above, while the formation temperature T1 of the channel layer (also to be the formation temperature of the spacer layer) is determined within the range of 1000° C.≤T1≤1200° C., the formation temperature T2 of the barrier layer is determined within the range of 650° C.≤T2≤900° C. Accordingly, after the channel layer 3 and the spacer layer 4 are formed, the susceptor temperature is lowered to form the barrier layer 5. Supposedly, if the barrier layer is formed directly on the channel layer 3 without forming the spacer layer 4, the surface of the channel layer 3 remains exposed when the temperature is lowered, so that the surface thereof may be etched by the atmosphere gas. On the other hand, as described in the present preferred embodiment, in the case that the spacer layer 4 is provided at the formation temperature T1 of the channel layer, the susceptor temperature is to be lowered after the spacer layer 4 is formed, so that the spacer layer 4 functions as a protection layer for protecting the surface of the channel layer 3. This is considered to contribute to improve the two dimensional electron gas mobility. When the barrier layer 5 has been formed, the epitaxial substrate 10A is completed.

The epitaxial substrate 10A is obtained, and then the HEMT device 10 is manufactured by using this. It should be noted that each of the following steps is carried out by a publicly known method.

First, a device isolation step is performed by etching and removing portions to be boundaries between individual devices to a depth of approximately 400 nm by a photolithography process and an RIE method. This device isolation step is only necessary for obtaining the plurality of HEMT devices 10 from a single epitaxial substrate 10A, and is not necessarily required as a step for the present invention.

After the device isolation step is performed, an $SiO_2$ film is formed on the epitaxial substrate 10A to have a predetermined thickness (e.g., 10 nm), and then, only the $SiO_2$ film at a portion in which the source electrode 6 and the drain electrode 7 are supposed to be formed is etched and removed by the photolithography process to form a $SiO_2$ pattern layer.

After the $SiO_2$ pattern layer is formed, each of the source electrode 6 and the drain electrode 7 made of Ti/Al/Ni/Au is formed on a portion in which it is supposed to be formed, by a vacuum evaporation method and the photolithography process. Subsequently, the source electrode 6 and the drain electrode 7 are subjected to the heat treatment for several tens of seconds (e.g., 30 seconds) in the atmosphere of nitrogen gas at a predetermined temperature between 650° C. and 1000° C. (e.g., 850° C.) in order to gain preferable ohmic quality.

After the heat treatment, only the $SiO_2$ film at a portion in which the gate electrode 8 is supposed to be formed is removed from the $SiO_2$ pattern layer by the vacuum evaporation method and the photolithography process, and then, the gate electrode 8 made of Pd/Au is formed on the portion in which it is supposed to be formed. The gate electrode 8 is formed as a Schottky metal pattern.

The HEMT device 10 is obtained by removing the rest of the $SiO_2$ pattern layer by the photolithography process.

As described above, according to the present preferred embodiment, if the epitaxial substrate is manufactured in the manner that the channel layer is formed of GaN, the spacer layer is formed of AlN, and the composition of the barrier layer is determined to satisfy the composition range defined by the formulas (1) to (4), the HEMT device is accomplished so as to be equipped with all of the two dimensional electron gas with high concentration of no less than $1.6 \times 10^{13}$ cm$^2$ and with high mobility of no less than 1300 cm$^2$V$^{-1}$s$^{-1}$, the low contact resistance of no more than $10 \times 10^{-6}$ Ω·cm$^2$, and the low gate leakage current of no more than 1.0 µAmm$^{-1}$, which have been difficult to be accomplished in the past. The barrier layer satisfying the above composition range is preferably formed under the atmosphere of nitrogen gas by appropriately determining the temperature, pressure, and V/III ratio.

<Variations>

In the above preferred embodiment, while the spacer layer 4 is formed of AlN, it may be formed of group III nitride having the composition of $Al_pGa_{1-p}N$ (wherein 0.8≤p<1), instead of AlN. Even when the spacer layer 4 is formed in this manner, the spacer layer 4 is formed to have a larger bandgap than that of any other barrier layer 5 defined by the formulas (1) to (4). In terms of improving the concentration and mobility of the two dimensional electron gas by suppressing the alloy scattering effect, it is the most preferable to form the spacer layer 4 with AlN that is a binary system compound of Al and N, however, the same extent of effect is produced even in the case of 0.95≤p≤1.

In the above preferred embodiment, while the channel layer 3 is formed of GaN, it may be formed of group III nitride having the composition of $Al_qGa_{1-q}N$ (wherein 0<q≤0.3), instead of GaN. Also, in this case, the composition range of the barrier layer satisfying the above four device characteristic criteria is defined in accordance with the composition of the channel layer 3.

EXAMPLES

Inventive Example 1

In the present inventive example, the HEMT device 10 according to the above preferred embodiment was manufactured. FIG. 7 is a view showing a list of the combinations of the composition of the barrier layer 5 in manufacturing the HEMT device 10 and the results of measuring the two dimensional electron gas concentration (2DEG concentration), the two dimensional electron gas mobility (2DEG mobility), the contact resistance, and the gate leakage current with respect to the resultant HEMT devices 10. In the present inventive example, 35 different types of the HEMT devices 10 were manufactured.

First, a (0001) plane sapphire substrate with 2 inch diameter was prepared as the substrate 1 to start manufacturing the epitaxial substrate 10A used for each of the HEMT devices 10. The substrate 1 was placed in the reactor of the MOCVD furnace and the atmosphere in the reactor was vacuumed. Thereafter, the pressure in the reactor was set to be 30 kPa and the atmosphere was formed in a state of hydrogen/nitrogen mixed flow, and then the temperature of the substrate was raised by susceptor heating.

At the time of reaching a temperature of 1200° C., the susceptor temperature was kept at this temperature for 10 minutes to perform the thermal cleaning. Next, the susceptor temperature was lowered to a temperature of 500° C., Ga material gas and ammonia gas were introduced to the reactor to form the GaN layer having a thickness of 25 nm as the buffer layer 2.

Next, the susceptor temperature was kept at the formation temperature T1 (° C.) of 1100° C., and Ga material gas and ammonia gas were introduced into the reactor to set the pressure in the reactor to be 100 kPa and form the GaN layer having a thickness of 3 µm as the channel layer 3. The hydrogen/nitrogen mixed gas was used for the bubbling gas and the carrier gas of the GA material gas.

After the channel layer 3 was obtained, the pressure in the reactor was maintained to be 10 kPa with the susceptor temperature kept at 1100° C. Then, Al material gas and ammonia gas were introduced into the reactor to form the MN layer having a thickness of 1 nm as the spacer layer 4. The hydrogen/nitrogen mixed gas was used for the bubbling gas and the carrier gas of the Al material gas.

After the spacer layer 4 was obtained, the temperature was kept at the formation temperature T2 (° C.) of the barrier layer of 800° C. and the atmosphere of nitrogen was formed in the reactor to set the pressure in the reactor to be 10 kPa. Next, the organic metal material gas and ammonia gas were introduced into the reactor with the flow ratio in accordance with the composition (target composition) shown in FIG. 7 to form the $In_xAl_yGa_zN$ layer having a thickness of 20 nm as the barrier layer 5. The nitrogen gas was used for the bubbling gas and carrier gas of the organic metal material, and the V/III ratio was to be approximately 10000.

After the barrier layer 5 was formed, the susceptor temperature was lowered to nearly the room temperature to recover the atmosphere in the reactor to be atmospheric pressure. Then, the reactor was exposed to air to extract the manufactured epitaxial substrate 10A. Thereby, the epitaxial substrate 10A was obtained.

Next, the HEMT device 10 was manufactured using this epitaxial substrate 10A. The HEMT device was designed to have a gate width of 1 mm, a source-gate interval of 0.5 a gate-drain interval of 7.5 µm, and a gate length of 1.5 µm.

To begin with, a portion to be a boundary between each of devices was etched and removed to a depth of approximately 400 nm by the photolithography method and RIE method.

Next, the $SiO_2$ film having a thickness of 10 nm was formed on the epitaxial substrate 10A. Then, $SiO_2$ film at a portion in which the source electrode 6 and the drain electrode 7 were supposed to be formed was etched and removed by the photolithography so as to obtain the $SiO_2$ pattern layer.

Next, the metal patterns made of Ti/Al/Ni/Au (each film thickness was 25/75/15/100 nm, respectively) were formed by the vacuum evaporation method and the photolithography process, at portions in which the source electrode 6 and the drain electrode 7 were supposed to be formed, so as to form the source electrode 6 and the drain electrode 7. Subsequently, the heat treatment for 30 seconds was performed in the atmosphere of nitrogen gas at 850° C. in order to obtain preferable ohmic quality of the source electrode 6 and the drain electrode 7.

Thereafter, the $SiO_2$ film at a portion in which the gate electrode 8 was supposed to be formed was removed from the $SiO_2$ pattern layer by the photolithography process, and then the gate electrode 8 made of Pd/Au (each film thickness was 30/100 nm, respectively) was formed as a Schottky metal pattern in the above portion by the vacuum evaporation method and the photolithography.

The HEMT device 10 was obtained by the above process.

In order to allow the measurement of the device characteristics, a passivation film of silicon nitride was formed by a CVD method and the photolithography process for the HEMT device 10, and then, contact holes were created on the positions corresponding to the source electrode 6, the drain electrode 7, and the gate electrode 8 of the passivation film to perform a wire bonding.

The two dimensional electron gas concentration and mobility were measured for the resultant plurality of HEMT devices 10 by the Hall effect method. The contact resistance was measured by the TLM method and the gate leakage current was measured by the 2-terminal gate-drain I-V method.

FIG. 7 shows a list of the results obtained by the above measurements. FIG. 2 through FIG. 5 are plots of each measurement result. Further, FIG. 6 is a plot of a ternary phase diagram with InN, AlN, and GaN as vertexes in accordance with four criteria shown by FIG. 2 through FIG. 5 with respect to data of FIG. 7.

From the above results, it has been confirmed that the epitaxial substrate having excellent characteristics was accomplished by forming the channel layer with GaN, the spacer layer with AlN, and then forming the barrier layer to satisfy the composition in the range surrounded with lines specified by the above formulas (1) to (4) in the ternary phase diagram, as shown in FIG. 6.

Inventive Example 2

In the present inventive example, four types of the HEMT devices were manufactured by the same procedure as the inventive example 1 other than intentionally mixing hydrogen into the atmosphere gas in manufacturing the barrier layer 5, and the two dimensional electron gas concentration was measured. The target composition of the barrier layer 5 was $In_{0.06}Al_{0.44}Ga_{0.5}N$. FIG. 8 is a view showing a list of measurement results of the two dimensional electron gas concentration of each HEMT device and ways of mixing hydrogen in the process of forming the barrier layer 5, the methods being employed in manufacturing the HEMT device according to the present inventive example. FIG. 8 also shows the measurement results of the two dimensional electron gas concentration of the HEMT devices in the inventive example 1 with the barrier layer 5 having the same composition as the present inventive example.

As shown in FIG. 8, the two dimensional electron gas concentration of the HEMT device in which hydrogen was mixed into the atmosphere gas in forming the barrier layer is significantly smaller than that of the HEMT device in which hydrogen was not mixed, and the HEMT device having the two dimensional electron gas concentration exceeding the device characteristic criterion of no less than $1.6 \times 10^{13}$ cm$^{-2}$ was not obtained. As a result, it has been confirmed to be effective to form the barrier layer in the atmosphere where hydrogen is not present, e.g., in the atmosphere of nitrogen gas as in the inventive example 1.

Inventive Example 3

In the present inventive example, nine types of HEMT devices were manufactured by the same procedure as the inventive example 1 other than differentiating the formation temperatures of the channel layer 3, the spacer layer 4, and the barrier layer 5. The target composition of the barrier layer 5 was $In_{0.06}Al_{0.04}Ga_{0.5}N$. The two dimensional electron gas concentration and mobility, the contact resistance, and the gate leakage current of the resultant HEMT device were measured. FIG. 9 is a view showing a list of the measurement results of the above each measurement and the formation temperature of each layer employed in manufacturing the HEMT devices according to the present inventive example. FIG. 9 also shows the measurement results of the HEMT device according to the inventive example 1 with the barrier layer 5 having the same composition as the present inventive example. In FIG. 9, the crosses are put to the measurement results not satisfying the device characteristic criterion.

From the results shown in FIG. 9, it has been confirmed that the HEMT device satisfying all the four device characteristic criteria is obtained by setting the formation temperature of the channel layer 3 to be no less than 1000° C. and no more than 1200° C., setting the formation temperature of the spacer layer 4 to be substantially same as the formation temperature of the channel layer 3, and setting the formation temperature of the barrier layer 5 to be no less than 650° C. and no more than 900° C.

Inventive Example 4

In the present inventive example, the HEMT devices were manufactured in the same procedure as the inventive example 1 other than differentiating the pressure in the reactor in forming the barrier layer 5. The target composition of the barrier layer 5 was $In_{0.06}Al_{0.44}Ga_{0.5}N$. The two dimensional electron gas concentration and mobility, the contact resistance, and the gate leakage current of the resultant HEMT devices were measured. FIG. 10 is a view showing a list of the measurement results of the above each measurement and the pressure in the reactor employed in manufacturing the HEMT devices according to the present inventive example. FIG. 10 also shows the measurement results of the HEMT devices according to the inventive example 1 with the barrier layer 5 having the same composition as the present inventive example. Specifically, the HEMT devices in which the formation temperatures of the GaN layer as the channel layer 3 and the AlN layer as the spacer layer 4 are 1100° C. and the formation temperature of the $In_{0.06}Al_{0.44}Ga_{0.5}N$ layer as the barrier layer 5 is 800° C. correspond to them.

From the results shown in FIG. 10, it has been confirmed that the HEMT device satisfying all the four device characteristic criteria is obtained by setting the pressure in the reactor in forming the barrier layer 5 to be no less than 1 kPa and no more than 30 kPa. It has been also confirmed that the HEMT device having lower ohmic contact resistance and less gate leakage current (preferable Schottky contact characteristic) is obtained by setting the pressure in the reactor to be no less than 1 kPa and no more than 20 kPa.

Inventive Example 5

In the present inventive example, the HEMT devices were manufactured by the same procedure as the inventive example 1 other than differentiating the V/III ratio in forming the barrier layer 5. The target composition of the barrier layer 5 was $In_{0.06}Al_{0.44}Ga_{0.5}N$. The two dimensional electron gas concentration and mobility, the contact resistance, and the gate leakage current of the resultant HEMT devices were measured. Further, the surface root mean square roughness (Rms) of the epitaxial substrate obtained in the process of manufacturing the HEMT device was measured by AFM. FIG. 11 is a view showing a list of the measurement results of the above each measurement and the V/III ratio in forming the barrier layer 5 employed in manufacturing the HEMT devices according to the present inventive example. FIG. 11 also shows the measurement results of the HEMT devices according to the inventive example 1 with the barrier layer 5 having the same composition as the present inventive example. Specifically, the HEMT devices having the V/III ratio of 10000 correspond to them. FIG. 12 is a view showing the obtained AFM images for the epitaxial substrate of a part of the HEMT devices. FIG. 12 (a) is the AFM image when the V/III ratio is 10000, and FIG. 12 (b) is the AFM image when the V/III ratio is 40000.

From the results shown in FIG. 11, it has been confirmed that the HEMT device satisfying all the four device characteristic criteria is obtained by setting the V/III ratio in forming the barrier layer 5 to be no less than 5000 and no more than 20000. In light of the values of the surface root mean square roughness shown in FIG. 11 and the AFM images shown in FIG. 12, the improvement of the surface flatness (reducing the surface root means square roughness) by appropriately selecting the V/III ratio is considered to be effective in improving the characteristics of the HEMT devices.

While the invention has been shown and described in detail, the foregoing description is in all aspects illustrative and not restrictive. It is therefore understood that numerous modifications and variations can be devised without departing from the scope of the invention.

What is claimed is:

1. An epitaxial substrate for a semiconductor device, comprising:
   a base substrate;
   a channel layer made of GaN, formed on said base substrate;
   a spacer layer made of a group III nitride having a composition of $Al_pGa_{1-p}N$ (wherein $0.8 \leq p \leq 1$), formed on said channel layer; and
   a barrier layer made of a group III nitride having a composition of $In_aAl_bGa_cN$ (wherein a+b+c=1), formed on said spacer layer, said group III nitride of said barrier layer including at least In, Al, and Ga;
   wherein the spacer layer consists of a single material composition layer formed directly on the channel layer,
   wherein the barrier layer consists of a single material composition layer formed directly on the spacer layer,
   wherein the entirety of a surface of each of the channel layer, the spacer layer and the barrier layer are parallel to a surface of the base substrate,
   wherein said channel layer, said spacer layer and said barrier layer are epitaxially formed in this order on said base substrate; and
   wherein a composition of said group III nitride of said barrier layer is within a range surrounded with lines represented by the following formulas on a ternary phase diagram with InN, AlN, and GaN as vertexes $4x=y=0.8(1-z)$, $19x=y=0.95(1-z)$, $z=0.6$, and $z=0.4$, wherein x, y and z represent respective axes of the ternary phase diagram, and wherein x, y and z respectively correspond to In, Al and Ga content of the composition of $In_aAl_bGa_cN$, and
   wherein a two dimensional electron gas concentration is no less than $1.6 \times 10^{13}$ cm$^{-2}$.

2. The epitaxial substrate for a semiconductor device according to claim 1, wherein said spacer layer is made of AlN.

3. The epitaxial substrate for a semiconductor device according to claim 1, wherein said base substrate is a sapphire substrate.

4. A semiconductor device comprising:
   a base substrate;
   a channel layer made of GaN, formed on said base substrate;
   a spacer layer made of a group III nitride having a composition of $Al_pGa_{1-p}N$ (wherein $0.8 \leq p \leq 1$), formed on said channel layer;
   a barrier layer made of a group III nitride having a composition of $In_aAl_bGa_cN$ (wherein a+b+c=1), formed on said spacer layer, said group III nitride of said barrier layer including at least In, Al, and Ga; and
   a source electrode, a drain electrode, and a gate electrode provided on said barrier layer;
   wherein the spacer layer consists of a single material composition layer formed directly on the channel layer,
   wherein the barrier layer consists of a single material composition layer formed directly on the spacer layer,
   wherein the entirety of a surface of each of the channel layer, the spacer layer and the barrier layer are parallel to a surface of the base substrate,
   wherein said channel layer, said spacer layer and said barrier layer are epitaxially formed in this order on said base substrate; and
   wherein a composition of said group III nitride of said barrier layer is within a range surrounded with lines represented by the following formulas on a ternary phase diagram with InN, AlN, and GaN as vertexes $4x=y=0.8(1-z)$, $19x=y=0.95(1-z)$ $z=0.6$ $z=0.4$ wherein x, y and z represent respective axes of the ternary phase diagram, and wherein x, y and z respectively correspond to In, Al and Ga content of the composition of $In_aAl_bGa_cN$, and wherein a two dimensional electron gas concentration is no less than $1.6 \times 10^{13}$ cm$^{-2}$.

5. The semiconductor device according to claim 4, wherein said spacer layer is made of AlN.

6. The semiconductor device according to claim 4, wherein said base substrate is a sapphire substrate.

7. A method of manufacturing an epitaxial substrate for a semiconductor device, comprising the steps of:
  a) epitaxially forming a channel layer made of GaN on a base substrate;
  b) epitaxially forming a spacer layer made of group III nitride having a composition of $Al_pGa_{1-p}N$ (wherein $0.8 \leq p < 1$) on said channel layer, and
  c) epitaxially forming a barrier layer made of group III nitride having a composition of $In_xAl_yGa_zN$ (wherein $x+y+z=1$) on said spacer layer, said group III nitride including at least In, Al, and Ga,
  wherein the spacer layer consists of a single material composition layer formed directly on the channel layer,
  wherein the barrier layer consists of a single material composition layer formed directly on the spacer layer,
  wherein the entirety of a surface of each of the channel layer, the spacer layer and the barrier layer are parallel to a surface of the base substrate,
  wherein said channel layer, said spacer layer and said barrier layer are epitaxially formed in this order on said base substrate; and
  wherein in said step c), the composition of said group III nitride is selected within the range surrounded with the lines represented by the following formulas defined in accordance with the composition of said group III nitride on a ternary phase diagram with InN, AlN, and GaN as vertexes $4x=y=0.8(1-z)$, $19x=y=0.95(1-z)$ $z=0.6$ $z=0.4$ wherein x, y and z represent respective axes of the ternary phase diagram, and wherein x, y and z respectively correspond to In, Al and Ga content of the composition of $In_aAl_bGa_cN$, and wherein a two dimensional electron gas concentration is no less than $1.6 \times 10^{13}$ cm$^{-2}$.

8. The method of manufacturing an epitaxial substrate for a semiconductor device according to claim 7, wherein an atmosphere gas other than a material gas in said step c) is nitrogen gas.

9. The method of manufacturing an epitaxial substrate for a semiconductor device according to claim 7, wherein the formation temperature of said spacer layer in said step b) is substantially same as that of said channel layer in said step a), and the formation temperature of said barrier layer in said step c) is lower than that of said channel layer.

10. The method of manufacturing an epitaxial substrate for a semiconductor device according to claim 9, wherein
  the formation temperature T1 (° C.) of said channel layer is determined within the range of $1000°$ C.$\leq T1 \leq 1200°$ C., and
  the formation temperature T2 (° C.) of said barrier layer is determined within the range of $650°$ C.$\leq T2 \leq 900°$ C.

11. The method of manufacturing an epitaxial substrate for a semiconductor device according to claim 7, wherein the pressure in a reactor in said step c) is no less than 1 kPa and no more than 30 kPa.

12. The method of manufacturing an epitaxial substrate for a semiconductor device according to claim 11, wherein the pressure in the reactor in said step c) is no less than 1 kPa and no more than 20 kPa.

13. The method of manufacturing an epitaxial substrate for a semiconductor device according to claim 7, wherein the V/III ratio in said step c) is no less than 5000 and no more than 20000.

14. The method of manufacturing an epitaxial substrate for a semiconductor device according to claim 7, wherein said spacer layer is formed of AlN in said step b).

15. The method of manufacturing an epitaxial substrate for a semiconductor device according to claim 7, wherein a sapphire substrate is used for said base substrate.

16. The epitaxial substrate for a semiconductor device according to claim 1, wherein a root mean square roughness of a heterojunction interface between said channel layer and said spacer layer is in a range of 0.1 nm and 3 nm.

* * * * *